United States Patent
Kim et al.

(10) Patent No.: US 11,823,932 B2
(45) Date of Patent: Nov. 21, 2023

(54) SUBSTRATE PROCESSING SYSTEM AND SUBSTRATE PROCESSING APPARATUS

(71) Applicant: SAMSUNG ELECTRONICS CO., LTD., Suwon-si (KR)

(72) Inventors: Eungjin Kim, Suwon-si (KR); Pyongil Cho, Hwaseong-si (KR); Hyeonjun Jeon, Anyang-si (KR); Kyoungho Kim, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 222 days.

(21) Appl. No.: 17/394,509

(22) Filed: Aug. 5, 2021

(65) Prior Publication Data

US 2022/0068684 A1    Mar. 3, 2022

(30) Foreign Application Priority Data

Aug. 26, 2020  (KR) .................. 10-2020-0107971
Jan. 14, 2021   (KR) .................. 10-2021-0005222

(51) Int. Cl.
*H01L 21/677* (2006.01)
*H01L 21/683* (2006.01)
*H01L 21/67* (2006.01)

(52) U.S. Cl.
CPC .. *H01L 21/67739* (2013.01); *H01L 21/67276* (2013.01); *H01L 21/67706* (2013.01); *H01L 21/67745* (2013.01); *H01L 21/6838* (2013.01)

(58) Field of Classification Search
CPC ......... H01L 21/67276; H01L 21/67706; H01L 21/67739; H01L 21/67745; H01L 21/6838; H01L 23/00; H01L 21/00; H01L 31/00; H01L 2221/00; H01L 2229/00
See application file for complete search history.

(56) References Cited

U.S. PATENT DOCUMENTS

| 5,373,451 A | 12/1994 | Furukawa |
| 6,122,566 A * | 9/2000 | Nguyen ............ H01L 21/67167 700/218 |
| 7,257,457 B2 | 8/2007 | Imai et al. |

(Continued)

FOREIGN PATENT DOCUMENTS

| KR | 19980022889 A | 7/1998 |
| KR | 20140051786 A | 5/2014 |

OTHER PUBLICATIONS

"Request for the Submission of an Opinion and English language translation", KR Application No. 10-2021-0005222, dated Jun. 12, 2023, 13 pp.

*Primary Examiner* — Kidest Bahta
(74) *Attorney, Agent, or Firm* — Myers Bigel, P.A.

(57) ABSTRACT

A substrate processing system includes manufacturing process equipment including a plurality of process chambers and a control server configured to control the manufacturing process equipment. When a transporting order of semiconductor substrates is transmitted from the control server to the manufacturing process equipment, the control server provides, to the manufacturing process equipment performing an Nth process cycle (where N is a natural number) in a first transporting order, a command to switch to a second transporting order from an N+1th process cycle immediately when a restriction on at least one process chamber, into which insertion of the semiconductor substrate is restricted, is lifted.

16 Claims, 10 Drawing Sheets

(56) References Cited

U.S. PATENT DOCUMENTS

| | | |
|---|---|---|
| 7,392,812 B2 | 7/2008 | Ohshimo et al. |
| 8,571,703 B2 | 10/2013 | Numakura et al. |
| 9,646,864 B2 | 5/2017 | Morisawa |
| 10,579,041 B2 | 3/2020 | Nurani et al. |
| 10,651,068 B1 | 5/2020 | Mizuguchi et al. |
| 2010/0168909 A1* | 7/2010 | Sato .................... C23C 14/568 700/228 |
| 2014/0044504 A1* | 2/2014 | Hofmeister ....... H01L 21/67742 414/217 |
| 2015/0040828 A1* | 2/2015 | Morisawa ......... H01L 21/67276 118/696 |
| 2017/0092517 A1* | 3/2017 | Ohashi ............. H01L 21/68707 |
| 2018/0300691 A1 | 10/2018 | Cui |

* cited by examiner

FIG. 9
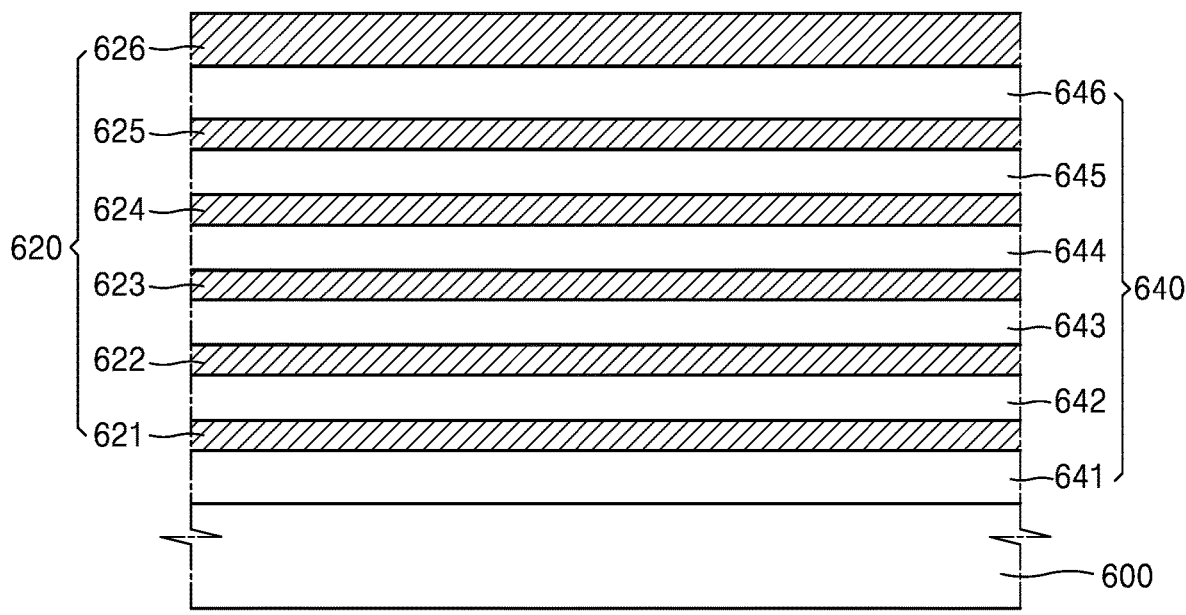
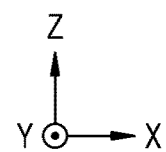

SUBSTRATE PROCESSING SYSTEM AND SUBSTRATE PROCESSING APPARATUS

CROSS-REFERENCE TO RELATED APPLICATIONS

This application is based on and claims priority under 35 U.S.C. § 119 to Korean Patent Application Nos. 10-2020-0107971, filed on Aug. 26, 2020, and 10-2021-0005222, filed on Jan. 14, 2021, in the Korean Intellectual Property Office, the disclosures of which are incorporated by reference herein in their entirety.

BACKGROUND

The inventive concept relates to a substrate processing system and a substrate processing apparatus, and more particularly, to a substrate processing system and a substrate processing apparatus, in which a transporting order of semiconductor substrates is controlled from a plurality of process chambers.

In a typical semiconductor device manufacturing process, various processes such as forming of a material layer on a semiconductor substrate or etching of the material layer may be repeatedly performed. In a substrate processing apparatus performing the above processes, a substrate processing system controlling a plurality of process chambers may be used. Thus, in the substrate processing system, it may be required to efficiently control a transporting order to return a semiconductor substrate between the plurality of process chambers and transfer a semiconductor substrate between a load port and the process chambers.

SUMMARY

The inventive concept provides increased efficiency of a substrate processing system by logically controlling a transporting order by a control server when a process chamber, into which insertion of a semiconductor substrate is restricted, is to be immediately used in single wafer-type equipment including a plurality of process chambers.

The inventive concept also provides increased productivity of a substrate processing apparatus by logically controlling a transporting order by a control server when a process chamber, into which insertion of a semiconductor substrate is restricted, is to be immediately used in single wafer-type equipment including a plurality of process chambers.

The objective of the inventive concept is not limited to those mentioned above, and other objectives that are not stated herein will be clearly understood by those skilled in the art from the following description.

According to an aspect of the inventive concept, there is provided a substrate processing system including: manufacturing process equipment comprising a plurality of process chambers and a control server configured to control the manufacturing process equipment. When a transporting order of semiconductor substrates is transmitted from the control server to the manufacturing process equipment, the control server is configured to provide to the manufacturing process equipment performing an Nth process cycle (where N is a natural number) in a first transporting order, a command to switch to a second transporting order from an N+1th process cycle when restriction on at least one process chamber, into which insertion of the semiconductor substrate is restricted, is lifted. Each process cycle is defined as an operation in which the semiconductor substrates are inserted into the plurality of process chambers to perform a certain process and then removed from the plurality of process chambers after the process.

According to another aspect of the inventive concept, there is provided a substrate processing apparatus including: a load port; manufacturing process equipment including a plurality of process chambers; and a control server configured to control the manufacturing process equipment. The control server is configured convert a transporting order for a process cycle into a new transporting order for a new process cycle when restriction on at least one process chamber, into which insertion of the semiconductor substrate is restricted, is lifted. Each process cycle is defined as an operation in which the semiconductor substrate is inserted from the load port into a process chamber to perform a semiconductor process and then returned to the load port after the semiconductor process.

According to another aspect of the inventive concept, there is provided a substrate processing apparatus including: a load port; a robot arm configured to transport a semiconductor substrate; a manufacturing process equipment including a plurality of process chambers; and a control server configured to control the manufacturing process equipment. The control server is configured to identify available process chambers, into which insertion of the semiconductor substrate is allowed, and unusable process chambers, into which insertion of the semiconductor substrate is not allowed. The robot arm performs an Nth process cycle (where N is a natural number) in the available process chambers in a first transporting order. A process cycle is defined as an operation in which a semiconductor substrate is inserted from the load port into a process chamber via the robot arm to perform a semiconductor process and then returned to the load port after the semiconductor process. The control server provides operating information, based on which the unusable process chambers are identified as available process chambers and the robot arm performs from an N+1th process cycle in a second transporting order, at a first time when the restriction on at least one of the unusable process chambers is lifted.

BRIEF DESCRIPTION OF THE DRAWINGS

Embodiments of the inventive concept will be more clearly understood from the following detailed description taken in conjunction with the accompanying drawings in which:

FIGS. 9 and 10 are cross-sectional views illustrating a process of manufacturing a semiconductor device by using a substrate processing apparatus according to the inventive concept.

DETAILED DESCRIPTION OF THE EMBODIMENTS

Hereinafter, an embodiment of the inventive concept will be described in detail with reference to the attached drawings.

Figure 1:
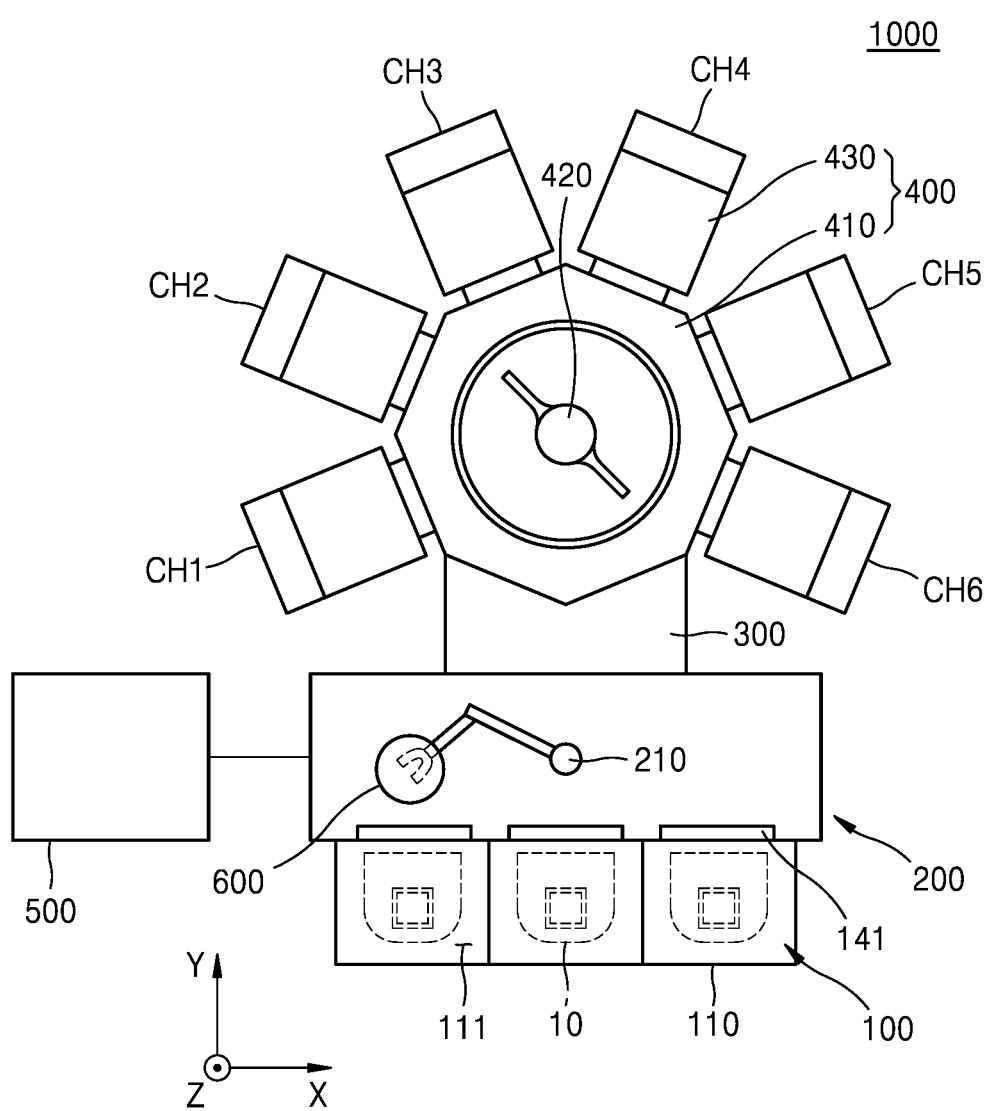
FIG. 1 is a plan view schematically illustrating a substrate processing apparatus according to an embodiment.

FIG. 1 is a plan view schematically illustrating a substrate processing apparatus according to an embodiment.

Referring to FIG. 1, a substrate processing apparatus 1000 may include a front end module 100, a transport module 200, a load lock chamber 300, a manufacturing process equipment 400, and a control server 500.

The front end module 100 may include a load port 110 providing an internal space 111 in which a substrate container 10 may be contained, and control the internal space 111 of the load port 110 to be at a vacuum pressure or an atmospheric pressure.

The front end module 100 may fill inner portions of the internal space 111 of the load port 110 and the substrate container 10 with nitrogen gas, inert gas, or clean dried air to boost a pressure of the inner portions of the internal space 111 and the substrate container 10 from a vacuum pressure to an atmospheric pressure.

The front end module 100 may maintain the internal space 111 at a vacuum pressure while a manufacturing process of a semiconductor substrate 600 is performed. Also, the front end module 100 may forcibly discharge a gas of the internal space 111 to reduce a pressure of the internal space 111 of the load port 110 from the atmospheric pressure to the vacuum pressure.

In some embodiments, the front end module 100 may maintain a pressure of the internal space 111 at a vacuum pressure that is lower than an external pressure (for example, atmospheric pressure) but higher than a vacuum atmosphere in the manufacturing process equipment 400, while a semiconductor manufacturing process is performed on the semiconductor substrate 600. Accordingly, gas or moisture remaining in the substrate container 10 that is on standby in the front end module 100 and a plurality of semiconductor substrates 600 contained in the substrate container 10 may be removed.

Even without reducing the pressure of the internal space 111 of the front end module 100 to a vacuum atmosphere of the manufacturing process equipment 400, contamination of the substrate container 10 and the semiconductor substrate 600 may be removed sufficiently without a decrease in the productivity of the substrate processing apparatus 1000.

The transport module 200 may be arranged at the back of the front end module 100. The transport module 200 may include a transport robot 210 that is provided to freely pivot to load or unload the plurality of semiconductor substrates 600 contained in the substrate container 10 that is on standby in the front end module 100. The transport robot 210 of the transport module 200 may transport a semiconductor substrate 600 in a non-processed state in the substrate container 10, to the load lock chamber 300, and a semiconductor substrate 600 with which a manufacturing process is completed in the manufacturing process equipment 400 and is on standby in the load lock chamber 300, to the substrate container 10.

In some embodiments, an inner portion of the transport module 200 may be maintained in a vacuum state to prevent the semiconductor substrate 600 from being exposed to the external air and contaminated while the transport robot 210 of the transport module 200 transports the semiconductor substrate 600. For example, a pressure of an inner, tightly sealable space of the transport module 200 may be maintained at a vacuum pressure.

Here, to prevent a change in an atmospheric pressure state of the transport module 200 when a first door 141 is opened to transport the semiconductor substrate 600, the front end module 100 may adjust a pressure in the load port 110 to be equal to that of the transport module 200.

The load lock chamber 300 may be arranged between the transport module 200 and the manufacturing process equipment 400. A pressure of the load lock chamber 300 may be adjusted to be at a vacuum pressure to prevent a change in an atmospheric pressure state of the transport module 200 and a transport chamber 410 of the manufacturing process equipment 400. A buffer stage (not shown) in which the semiconductor substrate 600 is on standby may be installed in the load lock chamber 300, and the semiconductor substrate 600 that has been transported from the transport robot 210 of the transport module 200 is on standby in the buffer stage while a pressure of the load lock chamber 300 is adjusted.

The load lock chamber 300 may form a vacuum atmosphere that is similar to that of the transport module 200 when the transport robot 210 of the transport module 200 loads or unloads the semiconductor substrate 600, and may thereby receive a non-processed semiconductor substrate 600 from the transport robot 210 of the transport module 200. Also, when a robot arm 420 in the transport chamber 410 of the manufacturing process equipment 400 loads or unloads the semiconductor substrate 600, the load lock chamber 300 may form a vacuum atmosphere that is similar to that of the transport chamber 410, thereby receiving a semiconductor substrate 600 with which a manufacturing process is completed.

The manufacturing process equipment 400 may be arranged at the back of the load lock chamber 300 and may include the transport chamber 410 and a plurality of process chambers 430. The manufacturing process equipment 400 may be, for example, a dry etching equipment, a chemical vapor deposition equipment, a thermal furnace, a developing equipment, or a cleaning equipment, but is not limited thereto.

The transport chamber 410 may be arranged between the load lock chamber 300 and the process chambers 430. The transport chamber 410 includes the robot arm 420 that is provided to freely pivot, and may be in charge of transporting the semiconductor substrate 600 that is on standby in the process chamber 430 and the load lock chamber 300.

The process chamber 430 may perform a semiconductor manufacturing process on the semiconductor substrate 600. An access gate through which the semiconductor substrate 600 is inserted or taken out may be installed between the process chambers 430 and the transport chamber 410. A plurality of process chambers 430 may be respectively installed along sides of the transport chamber 410. The process chambers 430 may include first through sixth process chambers CH1 through CH6 in a clockwise direction. However, while six process chambers 430 are illustrated in the drawings, the inventive concept is not limited thereto.

The semiconductor substrate 600 with which a semiconductor manufacturing process is completed in the process chambers 430 may be transported to the substrate container 10 that is on standby in the front end module 100 by using the robot arm 420 of the transport chamber 410. While the semiconductor substrate 600 is contained in the substrate container 10, an inner portion of the front end module 100 may be maintained in a vacuum state. Until the substrate container 10 is unloaded, the semiconductor substrate 600, with which a semiconductor manufacturing process is completed, is on standby in the front end module 100 which is in a vacuum state, and thus, gas or moisture remaining on the semiconductor substrate 600 may be removed.

Also, contaminants remaining on the semiconductor substrate 600 with which a semiconductor manufacturing process is completed may be removed during standby in the front end module 100, and thus, contamination of the semiconductor substrate 600 that is non-processed and contained in the substrate container 10, due to corrosive gas discharged from the semiconductor substrate 600, with which a manufacturing process is completed, may be prevented.

The control server 500 may include a device controller, a module controller, and a switching hub accessing the device controller and the module controller. While the control server 500 is illustrated in the drawings as being arranged at a side of the load lock chamber 300, the arrangement of the control server 500 is not limited thereto.

The control server 500 may be involved in an entire operation of a substrate processing system 10005 (see FIG. 4) by transmitting a control signal to each of components of the substrate processing apparatus 1000 based on a control program for implementing various processing on the semiconductor substrate 600 on which a semiconductor manufacturing process is performed and a process recipe including recordings of processing condition data. The substrate processing system 1000S (see FIG. 4) will be described in further detail later.

A representative example of the semiconductor substrate 600 processed in the substrate processing apparatus 1000 may be a wafer used to manufacture a semiconductor device. Other than the illustrated components of the substrate processing apparatus 1000, numerous systems may be required to perform a manufacturing process required for a complete manufacture of a semiconductor integrated circuit or a semiconductor chip. Here, for clear description of the inventive concept, description of common components or those understandable by one of one of ordinary skill in the art will be omitted.

Figure 2:
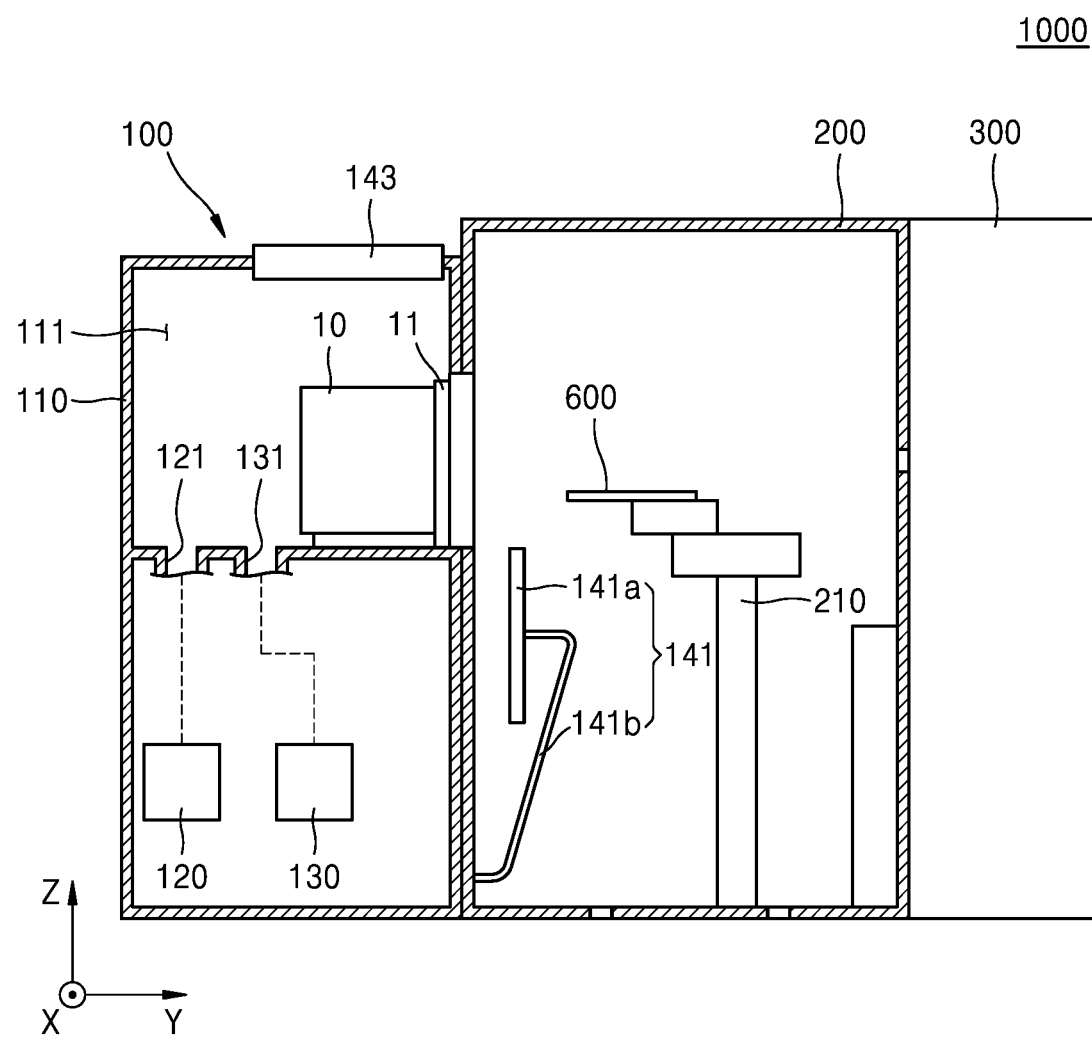
FIG. 2 is a cross-sectional view schematically illustrating a portion of a substrate processing apparatus according to an embodiment.

FIG. 2 is a cross-sectional view schematically illustrating a portion of a substrate processing apparatus according to an embodiment.

Referring to FIG. 2, the substrate processing apparatus 1000 may include the front end module 100 and the transport module 200 and the load lock chamber 300 that are arranged at the back of the front end module 100.

The front end module 100 may include the load port 110, the first door 141, a second door 143, a vacuum pump 120, and a gas supplier 130.

The first door 141 may be installed between the load port 110 and the transport module 200, and may be used to open or close an opening of the load port 110. The first door 141 may be opened to take out a non-processed semiconductor substrate 600 loaded in the substrate container 10 to the manufacturing process equipment 400 (see FIG. 1) or insert the semiconductor substrate 600 with which a manufacturing process is completed in the manufacturing process equipment 400 (see FIG. 1), into the substrate container 10. Also, the first door 141 may be closed to prevent a change in an atmospheric pressure state of the transport module 200 due to an atmospheric pressure state of the internal space 111 of the load port 110.

The second door 143 may be arranged to insert or take out the substrate container 10. For example, the second door 143 may be arranged in an upper portion of the load port 110 and open or close the opening of the load port 110. The second door 143 may be opened while the substrate container 10 is loaded from the front end module 100 or the substrate container 10 is unloaded from the front end module 100. Also, the second door 143 may be closed to block the internal space 111 of the load port 110 from the outside.

The internal space 111 of the load port 110, in which the substrate container 10 is contained, may be tightly sealed by a closing operation of the first door 141 and the second door 143. The first door 141 and the second door 143 may each include a slit valve to maintain a tightly sealed state of the internal space 111.

The first door 141 may open a container door 11 of the substrate container 10, the container door 11 opening or closing a front surface of the substrate container 10. For example, the first door 141 may include a door holder 141a and a support 141b. The door holder 141a may have a size and shape corresponding to those of the container door 11 of the substrate container 10, and include an opening/closing device to lock or unlock the container door 11 of the substrate container 10.

The support 141b may be fixed and coupled to a rear surface of the door holder 141a and move the door holder 141a. When the substrate container 10 is adhered to the first door 141 while the first door 141 closes the opening of the load port 110, the door holder 141a unlocks the container door 11 of the substrate container 10 and then adsorptively fixes the container door 11, and may move back to separate the container door 11 of the substrate container 10 from a main body of the substrate container 10.

The vacuum pump 120 may discharge a gas in the internal space 111 that is tightly sealed by a closing operation of the first door 141 and the second door 143. The vacuum pump 120 may discharge a gas of the internal space 111 via a discharge port 121 included in the load port 110.

The vacuum pump 120 may be connected to the discharge port 121 via a discharge line, and a pressure control valve and a flow control valve may be installed on the discharge line. As the vacuum pump 120 discharges the gas in the internal space 111, the inner portions of the internal space 111 and the substrate container 10 may be in a vacuum state.

The gas supplier 130 may inject a purge gas into the internal space 111 tightly sealed by a closing operation of the first door 141 and the second door 143. For example, the purge gas may be nitrogen gas, inert gas, or clean dried air. The gas supplier 130 supplies a purge gas into the internal space 111 via an injection port 131 included in the load port 110.

The gas supplier 130 may include a gas supply valve for adjusting a flow of a purge gas according to an electrical signal and various filters to remove foreign substances in the purge gas supplied to the internal space 111. As the gas supplier 130 injects the purge gas into the internal space 111, the inner portions of the internal space 111 and the substrate container 10 may be filled with the purge gas to be in an atmospheric pressure state.

The plurality of semiconductor substrates 600 that are contained in the substrate container 10 that is on standby in the front end module 100 may be taken out one by one to the manufacturing process equipment 400 (see FIG. 1), which is a single wafer-type equipment, in a preset transporting order by using the transport module 200.

In the substrate processing system 1000S (see FIG. 4) according to the inventive concept, the transporting order may be varied in real time according to the availability of the manufacturing process equipment 400 (see FIG. 1), as described in further detail later.

Figure 3:
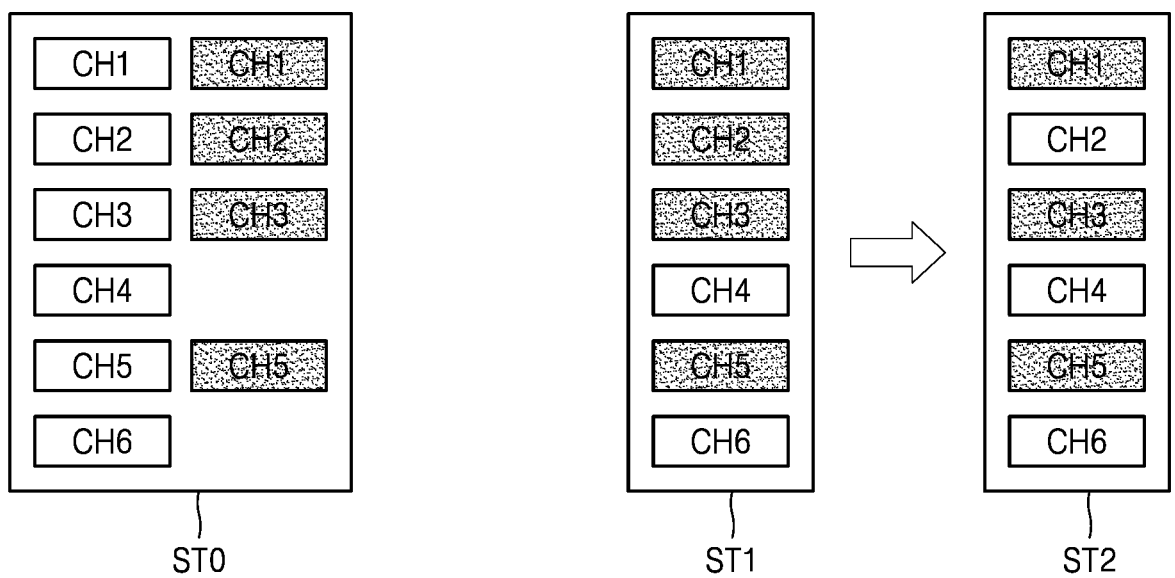
FIG. 3 is a diagram schematically illustrating an operating order of a substrate processing system according to an embodiment.
Figure 4:
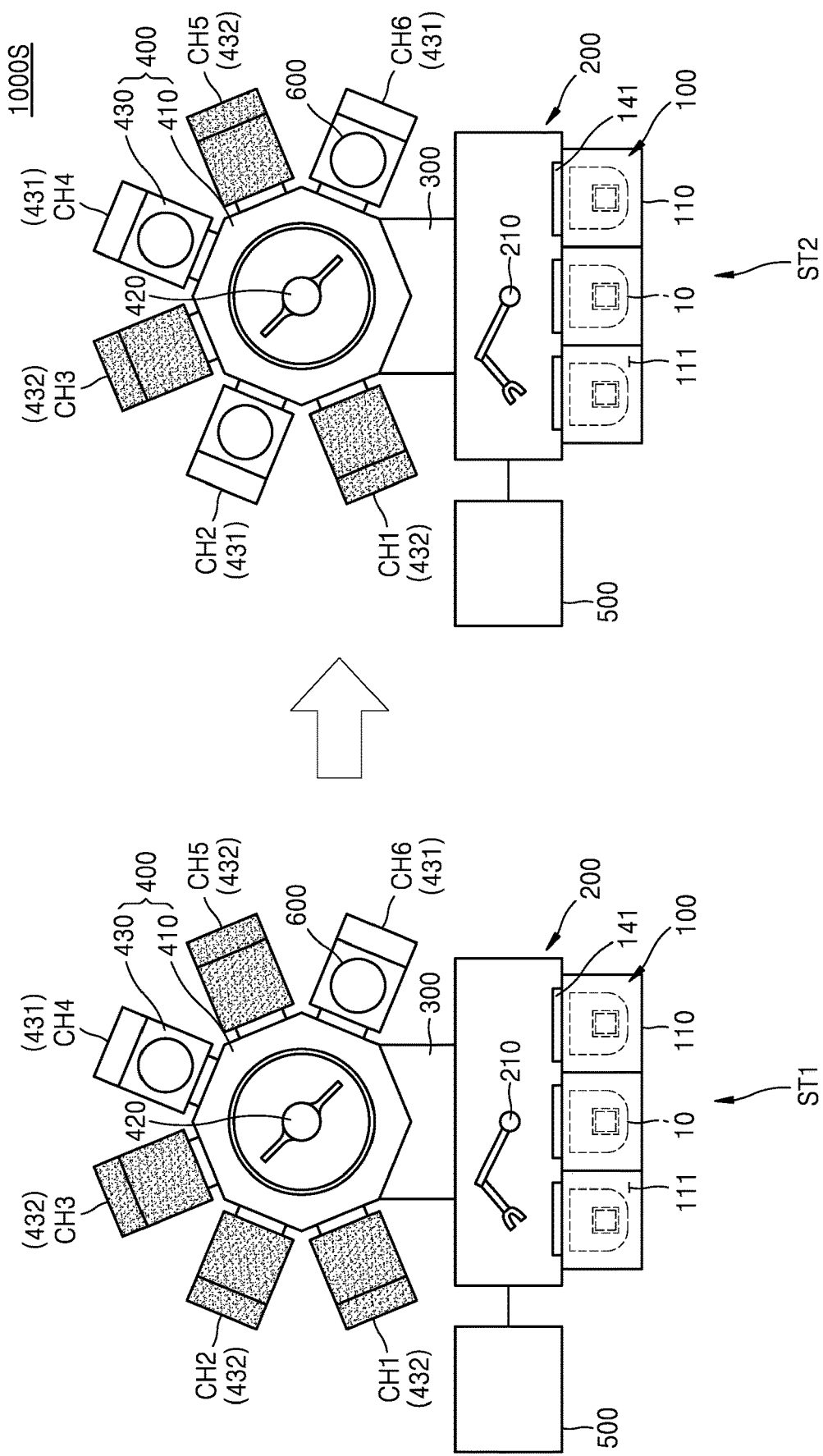
FIG. 4 is a diagram schematically illustrating an operation in which a substrate processing system according to an embodiment is operated in a substrate processing apparatus.

FIG. 3 is a diagram schematically illustrating an operating order of a substrate processing system according to an embodiment. FIG. 4 is a diagram schematically illustrating an operation in which a substrate processing system according to an embodiment is operated in a substrate processing apparatus.

Referring to FIGS. 3 and 4 together, the substrate processing system 1000S and the substrate processing apparatus 1000 implementing the substrate processing system 1000S are illustrated.

The substrate processing system 1000S according to the inventive concept is configured to provide operating information regarding a transporting order of the semiconductor substrate 600 from the control server 500 to the manufacturing process equipment 400 in regard to the manufacturing process equipment 400 including the plurality of process chambers 430 and the control server 500 controlling the manufacturing process equipment 400.

For clear description of the inventive concept, an operation in which a semiconductor substrate 600 is inserted into a process chamber 430 to perform a certain semiconductor manufacturing process and the semiconductor substrate 600 is taken out from the process chamber 430 again after the semiconductor process is defined as a process cycle. Also, the process chambers 430 may include first through sixth process chambers CH1 through CH6 in a clockwise direction. However, while six process chambers 430 are illustrated in the drawings, the inventive concept is not limited thereto.

The substrate processing system 1000S may provide, from the control server 500 to the manufacturing process equipment 400 that performs an Nth process cycle (N is a natural number) in a first transporting order ST1, operating information giving a command to make a switch to a second transporting order ST2, from an N+1th process cycle, immediately at a time when restriction on at least one process chamber 430, into which insertion of a semiconductor substrate 600 is restricted, is lifted.

In detail, the substrate processing system 1000S may give a command to transmit, from the control server 500 to the manufacturing process equipment 400, all operating information regarding the plurality of process chambers 430 immediately at a time when the substrate container 10 containing at least one semiconductor substrate 600 is loaded to the load port 110. To this end, the control server 500 may operate to logically control the operating information of the plurality of process chambers 430 according to a program. That is, the substrate processing system 1000S does not physically control operation of the process chambers 430 but may logically control operation of the process chambers 430 based on already programmed information.

Thus, with respect to all semiconductor substrates 600 contained in the substrate container 10, a semiconductor process is not only performed on only a process chamber 430, the operation of which is allowed in an initial transport state ST0. That is, a semiconductor manufacturing process may be performed on at least some of semiconductor substrates 600 contained in the substrate container 10 in the first transporting order ST1, and a semiconductor manufacturing process may be performed on some other ones among the semiconductor substrates 600 contained in the substrate container 10 in the second transporting order ST2.

For example, a program on an operating order of the first through sixth process chambers CH1 through CH6, which are all process chambers 430, is transmitted from the control server 500 to the manufacturing process equipment 400, in the initial transport state ST0. Among these, the fourth and sixth process chambers CH4 and CH6, which are operable, are included in the first transporting order ST1 (FIG. 4). Accordingly, a semiconductor substrate 600 may be inserted into only the fourth and sixth process chambers CH4 and CH6. Next, when the second process chamber CH2, which was unable to operate in the initial transport state ST0, is turned into an operable state, the second, fourth, and sixth process chambers CH2, CH4, and CH6 are included in the second transporting order ST2 (FIG. 4). Accordingly, the semiconductor substrate 600 may be inserted into only the second, fourth, and sixth process chambers CH2, CH4, and CH6.

As described above, a semiconductor manufacturing process may be performed on all semiconductor substrates 600 contained in one substrate container 10, not only via the fourth and sixth process chambers CH4 and CH6 set according to the initial transport state STO, but a semiconductor manufacturing process may be further performed in the second process chamber CH2.

The operating information of the substrate processing system 1000S may identify a process chamber, into which insertion of a semiconductor substrate 600 is allowed, from among the plurality of process chambers 430, as an available process chamber 431, and a process chamber, into which insertion of a semiconductor substrate 600 is restricted, from among the plurality of process chambers 430, as an unusable process chamber 432. For example, as illustrated in the left hand side of FIG. 4, the first, second, third, and fifth process chambers CH1, CH2, CH3, and CH5 may be the unusable process chambers 432, and the fourth and sixth process chambers CH4 and CH6 may be the available process chamber 431.

The unusable process chamber 432 here indicates a process chamber 430 that is in a state in which performing of a process on the semiconductor substrate 600 is restricted for certain reasons. For example, the unusable process chamber 432 refers to a process chamber 430 that is in a state in which a normal semiconductor manufacturing process is impossible, for example, when regular maintenance is performed or a problem has occurred in performing a process.

However, an unusable process chamber 432 may be identified as an available process chamber 431 anytime when the regular maintenance is finished or the cause of the problem is resolved. Accordingly, the control server 500 may newly set a transporting order each time when each semiconductor substrate 600 is input to the process chamber 430.

According to the operating information of the substrate processing system 1000S, the manufacturing process equipment 400 may identify the unusable process chamber 432 as an available process chamber 431 at a time when the restriction of insertion of a semiconductor substrate into the unusable process chamber 432 is lifted, and may perform the second transporting order ST2 by including the now-available process chamber 431, which was previously an unusable process chamber 432. For example, as illustrated in the right hand side of FIG. 4, the second process chamber CH2 is an example of a process chamber 430 that was formerly an unusable process chamber 432, but now is identified as an available process chamber 431.

The substrate processing system 1000S may transmit a control signal to each component of the substrate processing apparatus 1000 based on a process recipe including recordings of process condition data or the like. In some embodiments, at least some of the available process chambers 431 may perform a process recipe in a semiconductor manufacturing process order of the semiconductor substrate 600.

Accordingly, the substrate processing system 1000S may include only the available process chamber 431, on which performing of the process recipe is allowed, in the first transporting order ST1. Also, the substrate processing system 1000S may include only the available process chamber 431, on which performing of the process recipe is allowed, in the second transporting order ST2. The second transporting order ST2 may include more process chambers 430 than the first transporting order ST1 to perform the process cycle.

According to the substrate processing system 1000S and the substrate processing apparatus 1000 of the inventive concept, there is ultimately the effect of improving the efficiency of the substrate processing system 1000S and the productivity of the substrate processing apparatus 1000 by logically controlling a transporting order from the control server 500 when a chamber, into which insertion of a semiconductor substrate 600 is restricted, is to be immediately used by the manufacturing process equipment 400 including the plurality of process chambers 430.

Figure 5:
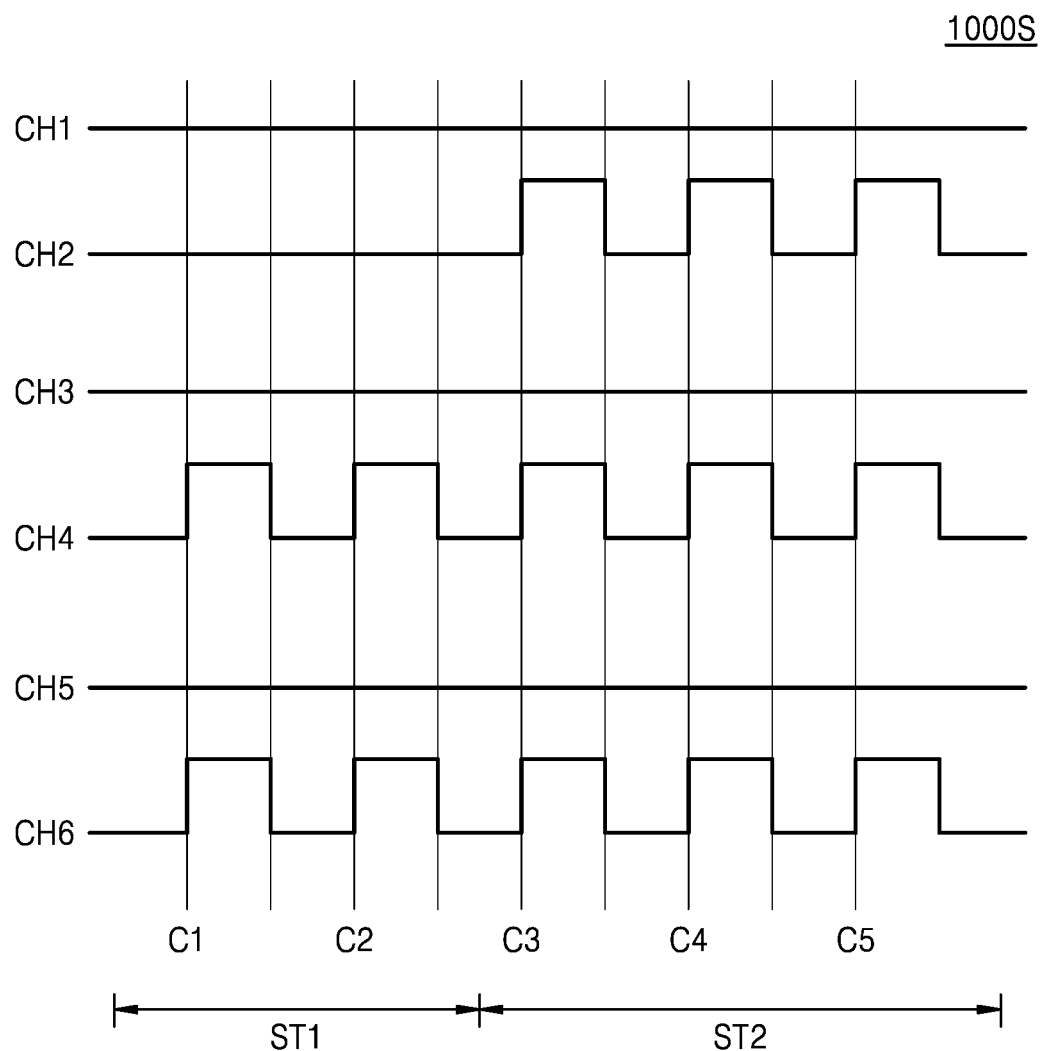
FIG. 5 is a diagram linearly illustrating a process in which each process cycle is operated in a substrate processing system according to an embodiment.

FIG. 5 is a diagram linearly illustrating a process in which each process cycle is operated in a substrate processing system according to an embodiment.

Referring to FIG. 5, the manufacturing process equipment 400 (see FIG. 4) performing an Nth process cycle (N is a natural number) in the substrate processing system 1000S is illustrated.

For clear description of the substrate processing system 1000S according to the inventive concept, a process cycle is defined by operations from inserting a semiconductor substrate 600 (see FIG. 4) into a process chamber 430 (see FIG. 4) to perform a certain semiconductor manufacturing process and taking the semiconductor substrate out again from the process chamber 430 after the semiconductor manufacturing process (see FIG. 4).

For example, a process cycle may include first through fifth process cycles C1 through C5. However, while five process cycles are illustrated in the drawing, the inventive concept is not limited thereto.

As described above, the process cycle may be performed only in the available process chamber 431 (see FIG. 4) in the manufacturing process equipment 400 (see FIG. 4). In detail, the first and second process cycles C1 and C2 may be performed in the fourth and sixth process chambers CH4 and CH6, and the third through fifth process cycles C3, C4, and C5 may be performed in the second, fourth, and sixth process chambers CH2, CH4, and CH6. In other words, the first and second process cycles C1 and C2 may be performed in the first transporting order ST1, and the third through fifth process cycles C3, C4, and C5 may be performed in the second transporting order ST2.

The above process cycles may be performed simultaneously in each of the available process chambers 431 (see FIG. 4) or with a time difference. This may be due to process recipe that may be performed in each of the available process chambers 431 (see FIG. 4).

Figure 6:
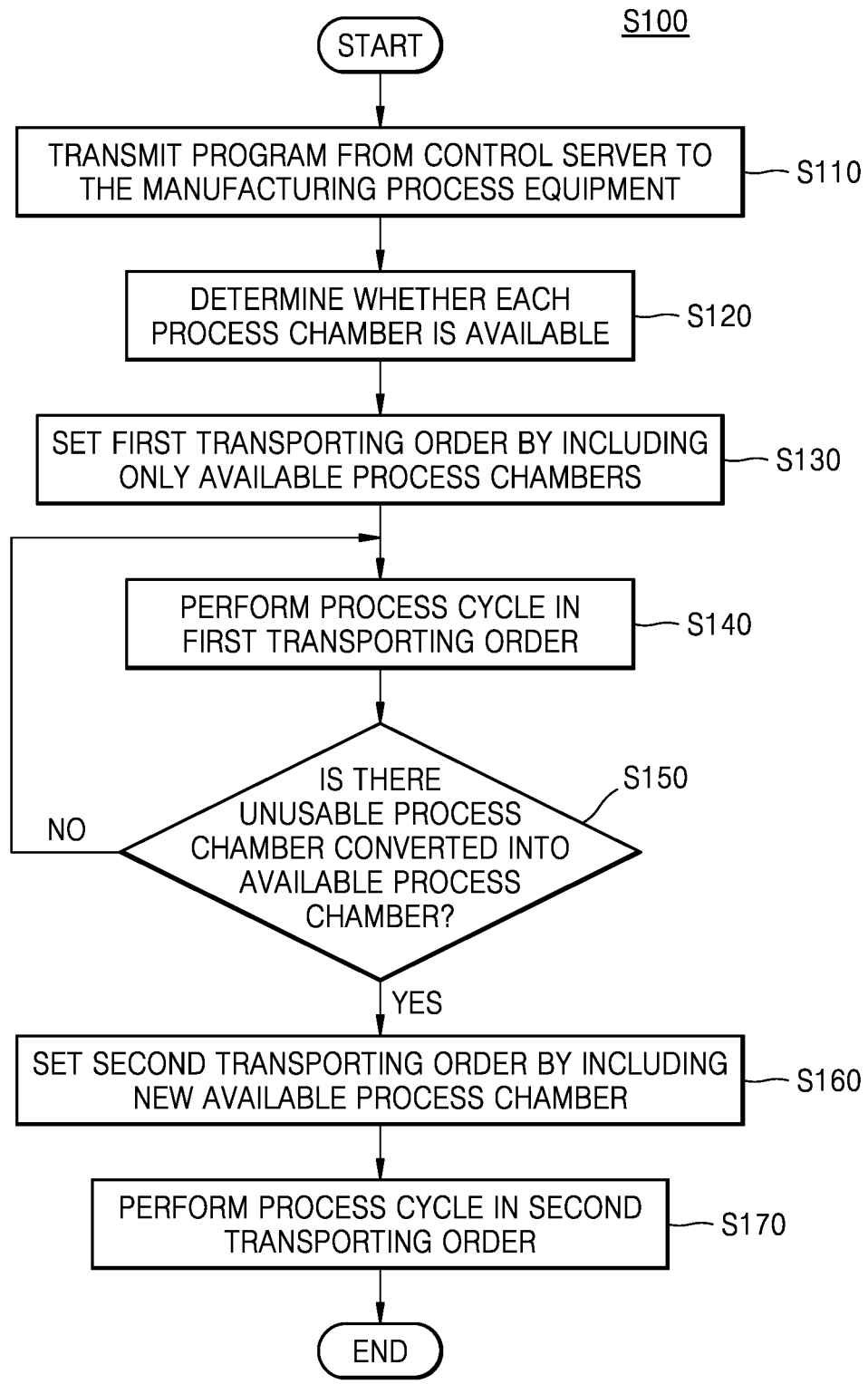
FIG. 6 is a flowchart of a substrate proceeding method by using a substrate processing system according to an embodiment.

FIG. 6 is a flowchart of a substrate proceeding method performed by using a substrate processing system according to an embodiment.

In a substrate proceeding method S100 performed by using the substrate processing system 1000S (see FIG. 4) described below, when an embodiment is implementable in another manner, a predetermined process order may be different from a described one. For example, two processes that are consecutively described may be substantially and simultaneously performed or may be performed in an opposite order to the described order.

Referring to FIG. 6, the substrate proceeding method S100 performed by using the substrate processing system 1000S (see FIG. 4) is illustrated.

First, according to the substrate proceeding method S100 of the inventive concept, a first operation (S110) of transmitting an operating order of all process chambers from a control server to a manufacturing process equipment may be performed.

Next, in the substrate proceeding method S100 according to the inventive concept, a second operation (S120) of determining whether each process chamber is available may be performed. Then, a third operation (S130) of setting a first transporting order by including only available process chambers may be performed. Next, a fourth operation (S140) of performing a process cycle in available process chambers in the first transporting order may be performed. Next, a fifth operation (S150) of identifying a process chamber that is converted from a unusable process chamber into an available process chamber may be performed. Next, when there is a process chamber converted into an available process chamber in the fifth operation (S150), a sixth operation (S160) of setting a second transporting order by including a new available process chamber may be performed.

Finally, according to the substrate proceeding method S100 of the inventive concept, a seventh operation (S170) of performing a process cycle in an available process chamber in the second transporting order may be performed.

Figure 7:
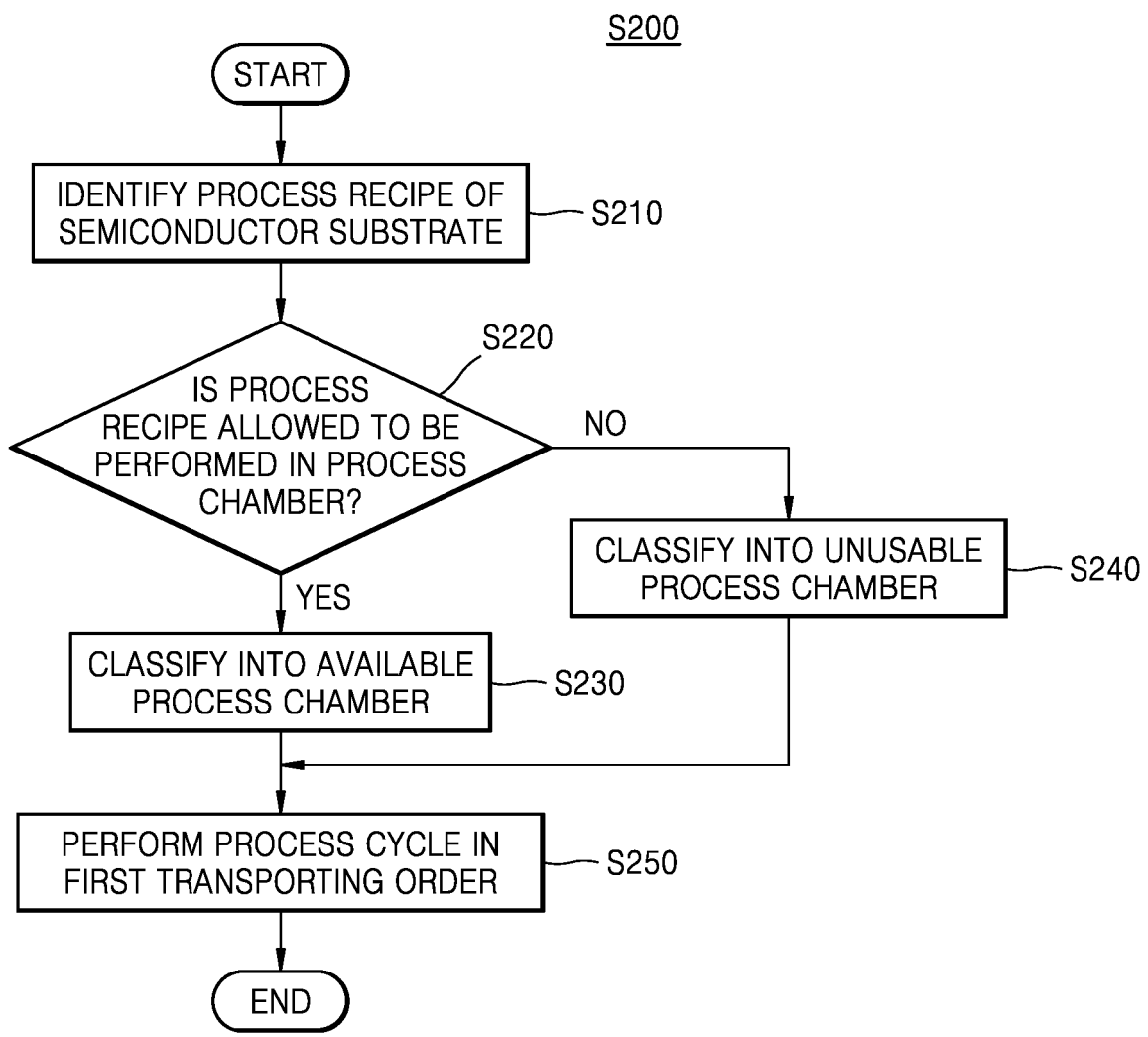
FIG. 7 is a flowchart of a substrate proceeding method performed by using a substrate processing system according to another embodiment.

FIG. 7 is a flowchart of a substrate proceeding method performed by using a substrate processing system according to another embodiment.

Referring to FIG. 7, a substrate proceeding method S200 performed by using an operation of identifying a process recipe of the substrate processing system 1000S (see FIG. 4) is illustrated in an order.

First, according to the substrate proceeding method S200 of the inventive concept, a first operation (S210) of identifying a process recipe, based on which a semiconductor manufacturing process is to be performed in a manufacturing process order of a semiconductor substrate, may be performed.

Next, according to the substrate proceeding method S200 of the inventive concept, a second operation (S220) of determining whether the process recipe that is identified in the first operation (S210) is performed in each process chamber. Then, a third operation (S230) of classifying, into an available process chamber, a process chamber in which the process recipe is identified in the first operation (S210) to be allowed to be performed may be performed. At the same time as the third operation (S230), a fourth operation (S240) of classifying, into a unusable process chamber, a process chamber in which the process recipe is identified in the first operation (S210) to be not allowed to be performed may be performed.

Finally, according to the substrate proceeding method S200 of the inventive concept, a fifth operation (S250) of performing a process cycle in an available process chamber in the first transporting order may be performed.

Figure 8:
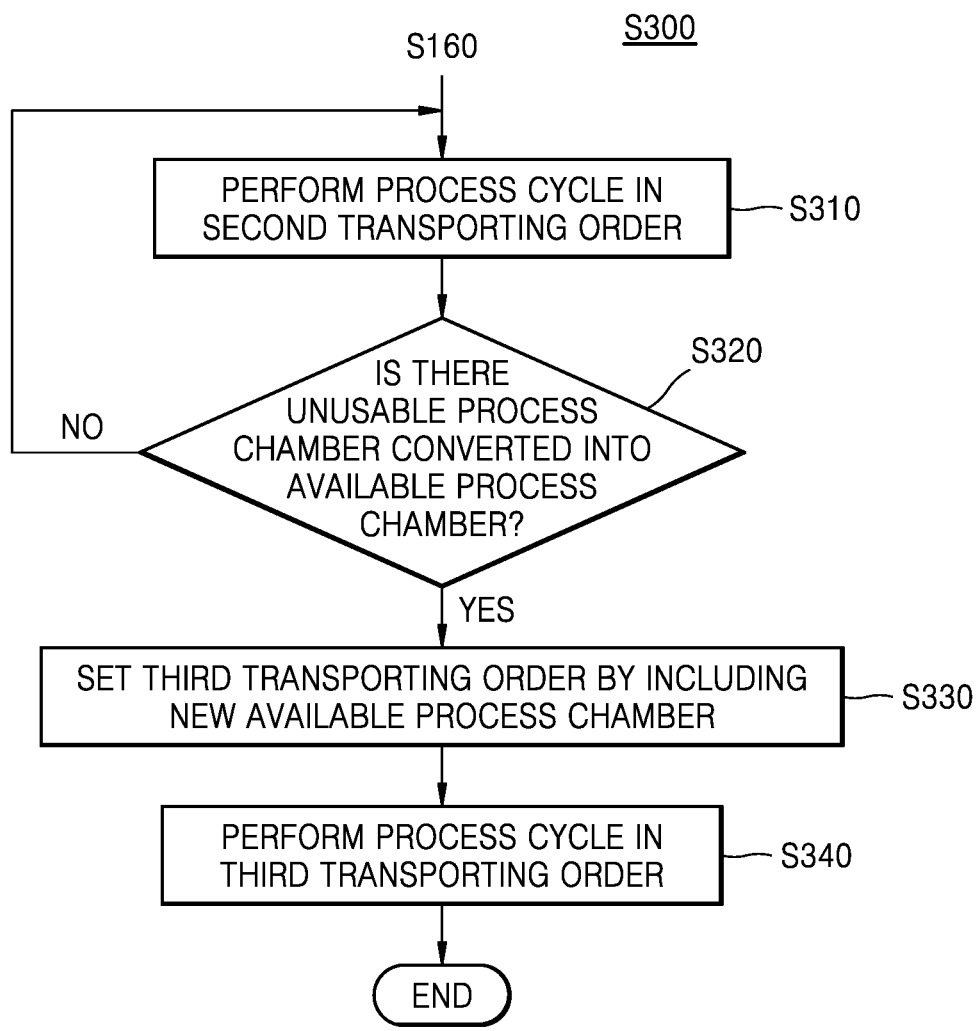
FIG. 8 is a flowchart of a substrate proceeding method performed by using a substrate processing system according to another embodiment.

FIG. 8 is a flowchart of a substrate proceeding method performed by using a substrate processing system according to another embodiment.

In a substrate proceeding method S300 performed by using the substrate processing system 1000S (see FIG. 4) described below, when an embodiment is implementable in another manner, a predetermined process order may be different from a described one. For example, two processes that are consecutively described may be substantially and simultaneously performed or may be performed in an opposite order to the described order.

Referring to FIG. 8, the substrate proceeding method S300 performed by using the substrate processing system 1000S (see FIG. 4) is illustrated.

First, in the substrate proceeding method S300 according to the inventive concept, up to the sixth operation (S160) of the substrate proceeding method S100 described with reference to FIG. 6 may be performed substantially in an identical manner. Thus, detailed description of the first through sixth operations (S110 through S160) will be omitted.

Next, according to the substrate proceeding method S300 of the inventive concept, a first operation (S310) of performing a process cycle in an available process chamber in the second transporting order may be performed. Next, a second operation (S320) of identifying a process chamber that is converted from an unusable process chamber into an available process chamber may be performed. Next, when there is a process chamber converted into an available process chamber in the second operation (S320), a third operation (S330) of setting a third transporting order by including the new available process chamber may be performed.

Finally, according to the substrate proceeding method S300 of the inventive concept, a fourth operation (S340) of performing a process cycle in the available process chamber in the third transporting order may be performed.

Figure 10:
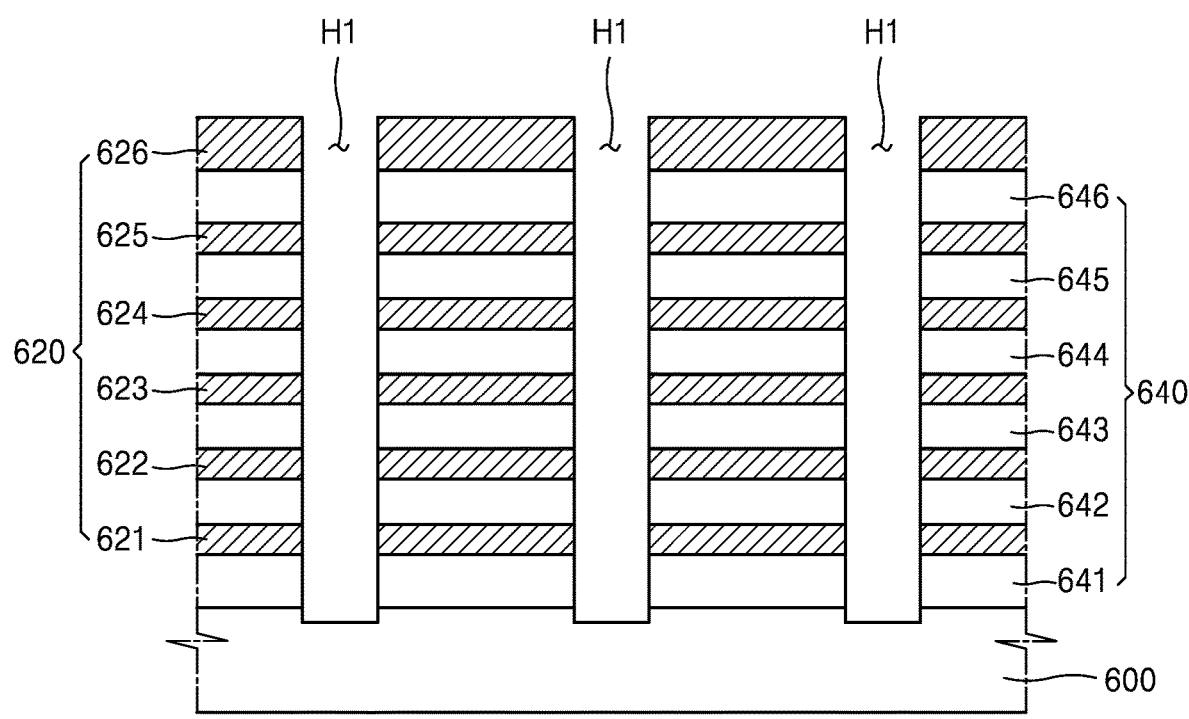

FIGS. 9 and 10 are cross-sectional views illustrating a process of manufacturing a semiconductor device by using a substrate processing apparatus according to the inventive concept.

Referring to FIG. 9, by using the substrate processing apparatus 1000 (see FIG. 1) according to the inventive concept, interlayer insulating layers 620 and sacrificial layers 640 may be alternately formed on the semiconductor substrate 600.

The semiconductor substrate 600 may include, for example, silicon (Si). Alternatively, the semiconductor substrate 600 may include a semiconductor element such as germanium (Ge), or a compound semiconductor such as silicon carbide (SiC), gallium arsenide (GaAs), indium arsenide (InAs), and indium phosphide (InP). Alternatively, the semiconductor substrate 600 may have a silicon-on-insulator (SOI) structure. For example, the semiconductor substrate 600 may include a buried oxide (BOX) layer. Also, the semiconductor substrate 600 may include a conductive area, for example, an impurity-doped well or an impurity-doped structure. Also, the semiconductor substrate 600 may include various device isolation structures such as a shallow trench isolation (STI).

Also, the semiconductor substrate 600 may have a thickness of about 0.1 mm to about 1 mm. When the thickness of the semiconductor substrate 600 is too small, the mechanical intensity thereof may be insufficient; when the thickness of the semiconductor substrate 600 is too thick, subsequent grinding may take a long time and the productivity of semiconductor products may be degraded.

In some embodiments, a lower structure (not shown) including at least one transistor may be arranged between the semiconductor substrate 600 and a lowermost sacrificial layer 641.

The interlayer insulating layers 620 may include a plurality of interlayer insulating layers 621 through 626, and the sacrificial layers 640 may include a plurality of sacrificial layers 641 through 646, and the plurality of interlayer insulating layers 621 through 626 and the plurality of sacrificial layers 641 through 646 may be alternately stacked on the semiconductor substrate 600, starting from the lowermost sacrificial layer 641, as illustrated in FIG. 9.

The sacrificial layers 640 may include a material that may be etched with an etch selectivity with respect to the interlayer insulating layers 620. That is, in a process of etching the sacrificial layers 640 by using a certain etching recipe, the sacrificial layers 640 may be formed of a material that may be etched while minimizing etching of the interlayer insulating layers 620. The above etching selectivity may be quantitatively expressed through a ratio of an etching rate of the sacrificial layers 640 to an etching rate of the interlayer insulating layers 620.

In some embodiments, the sacrificial layers 640 may include one of materials having an etching selectivity of about 1:10 to about 1:200 with respect to the interlayer insulating layers 620. For example, the interlayer insulating layers 620 may include one selected from silicon oxide and silicon nitride, and the sacrificial layers 640 may include one selected from silicon, silicon oxide, silicon carbide, and silicon nitride, which is different from the interlayer insulating layers 620.

Meanwhile, in some embodiments, the first sacrificial layer 641 and the sixth sacrificial layer 646 may be thicker than the second through fifth sacrificial layers 642 through 645. Also, the first interlayer insulating layer 621 and the fifth interlayer insulating layer 625 may be thicker than the second through fourth interlayer insulating layers 622 through 624. However, the inventive concept is not limited thereto, and thicknesses of the interlayer insulating layers 620 and the sacrificial layers 640 may vary, and the number of interlayer insulating layers 620 and the number of sacrificial layers 640 may also vary.

Referring to FIG. 10, by using the substrate processing apparatus 1000 (see FIG. 1) according to the inventive concept, a plurality of openings H1 passing through the interlayer insulating layers 620 and the sacrificial layers 640 that are alternately stacked may be formed.

The plurality of openings H1 may define a space in which a semiconductor region is to be formed in a semiconductor device. The plurality of openings H1 may be trenches having a depth in a Z-direction and extending in a Y-direction. Also, the plurality of openings H1 may be arranged apart from each other by a certain distance in an X-direction to be repeatedly formed.

An operation of forming the plurality of openings H1 may include an operation of forming a mask pattern defining locations of the plurality of openings H1 in the interlayer insulating layers 620 and the sacrificial layers 640 that are alternately stacked and an operation of anisotropically and alternately etching the interlayer insulating layers 620 and the sacrificial layers 640 by using the mask pattern as an etching mask.

Meanwhile, in some embodiments, when the interlayer insulating layers 620 and the sacrificial layers 640 are formed directly on the semiconductor substrate 600, the plurality of openings H1 may be formed to expose a portion of an upper surface of the semiconductor substrate 600 as illustrated in the drawing. Moreover, as a result of excessive etching in the anisotropic dry etching process, the semiconductor substrate 600 under the plurality of openings H1 may be recessed at a certain depth.

According to the inventive concept, when performing a manufacturing process as described above, the productivity of the substrate processing apparatus 1000 (see FIG. 1) may be improved by logically controlling a transporting order from the control server 500 (see FIG. 1) when a chamber, into which insertion of a semiconductor substrate 600 is restricted, is to be immediately used by the manufacturing process equipment 400 (see FIG. 1) including the plurality of process chambers 430 (see FIG. 1).

While the inventive concept has been particularly shown and described with reference to embodiments thereof, it will be understood that various changes in form and details may be made therein without departing from the scope of the following claims.

What is claimed is:

1. A substrate processing system comprising:
manufacturing process equipment comprising a plurality of process chambers and a control server,
wherein, when a transporting order of semiconductor substrates is transmitted from the control server to the manufacturing process equipment,
the control server is configured to provide, to the manufacturing process equipment performing an Nth process cycle (where N is a natural number) in a first transporting order, a command to switch to a second transporting order from an N+1th process cycle when a restriction on at least one process chamber, into which insertion of the semiconductor substrates is restricted, is lifted,
wherein each process cycle is defined as an operation in which the semiconductor substrates are inserted into the plurality of process chambers to perform a certain process and then removed from the plurality of process chambers after the process
wherein the control server is configured to transmit operating information of the plurality of process chambers to the manufacturing process equipment when a substrate container containing the semiconductor substrates is loaded into a front end module of the manufacturing process equipment,
wherein a first group of one or more of the semiconductor substrates contained in the substrate container are processed in the first transporting order, and
wherein a second group of one or more of the semiconductor substrates contained in the substrate container are processed in the second transporting order, wherein the first and second groups of semiconductor substrates are different.

2. The substrate processing system of claim 1, wherein the control server logically controls the operating information of the plurality of process chambers based on a control program.

3. The substrate processing system of claim 1, wherein the operating information identifies a first process chamber, into which insertion of the semiconductor substrates is allowed, from among the plurality of process chambers, as an available process chamber,
and identifies a second process chamber, into which insertion of the semiconductor substrate is restricted, from among the plurality of process chambers, as an unusable process chamber.

4. The substrate processing system of claim 3, wherein the manufacturing process equipment identifies previously designated unusable process chambers as available process chambers, and
performs the second transporting order by including the available process chambers at a time when the restriction of insertion into the previously designated unusable process chambers is lifted.

5. The substrate processing system of claim 3, wherein at least some of the available process chambers are allowed to perform a process recipe in a process order of the semiconductor substrates, and
only the available process chambers, on which the process recipe is allowed to be performed, are included in the first transporting order.

6. The substrate processing system of claim 5, wherein only the available process chambers, on which the process recipe is allowed to be performed, are included in the second transporting order.

7. The substrate processing system of claim 1, wherein the second transporting order comprises more process chambers than the first transporting order to perform the N+1 th process cycle.

8. The substrate processing system of claim 1, wherein the control server sets the transporting order each time when the semiconductor substrates are input to the plurality of process chambers.

9. A substrate processing apparatus comprising:
a load port;
a robot arm configured to transport a semiconductor substrate;
manufacturing process equipment comprising a plurality of process chambers; and
a control server configured to control the manufacturing process equipment,
wherein
the control server is configured to identify available process chambers, into which insertion of the semiconductor substrate is allowed, and unusable process chambers, into which insertion of the semiconductor substrate is not allowed, and
the robot arm performs an Nth process cycle (where N is a natural number) in the available process chambers in a first transporting order, wherein a process cycle is defined as an operation in which a semiconductor substrate is inserted from the load port into a process chamber via the robot arm to perform a semiconductor process and then returned to the load port after the semiconductor process, and
the control server provides operating information, based on which the unusable process chambers are identified as available process chambers and the robot arm performs an N+1th process cycle in a second transporting order, at a first time when a restriction on at least one of the unusable process chambers is lifted,
wherein the control server provides, to the manufacturing process equipment that performs an Mth process cycle (where M is a natural number equal to or greater than N+1) in the second transporting order, operating information, based on which the unusable process chambers are identified as available process chambers from an M+1th process cycle to perform a third transporting order, at a second time when the restriction on the at least one unusable process chamber is lifted again.

10. The substrate processing apparatus of claim 9, wherein at least some of the available process chambers are allowed to perform a process recipe according to the semiconductor process, and
only the available process chambers allowed to perform the process recipe are included in the first through third transporting orders.

11. The substrate processing apparatus of claim 9, wherein a number of process chambers included in the second transporting order is greater than a number of process chambers included in the first transporting order, and
a number of process chambers included in the third transporting order is greater than a number of process chambers included in the second transporting order.

12. A substrate processing apparatus comprising:
a load port;
manufacturing process equipment comprising a plurality of process chambers; and
a control server configured to control the manufacturing process equipment,
wherein the control server is configured to convert a transporting order for a process cycle into a new transporting order for a new process cycle after a restriction on at least one process chamber, into which insertion of a semiconductor substrate is restricted, is lifted,
wherein each process cycle is defined as an operation in which the semiconductor substrate is inserted from the load port into a process chamber to perform a semiconductor process and then returned to the load port after the semiconductor process,
wherein the control server provides operating information to the manufacturing process equipment, and
the operating information identifies a first process chamber, into which insertion of the semiconductor substrate is allowed, from among the plurality of process chambers, as an available process chamber,
and a second process chamber, into which insertion of the semiconductor substrate is restricted, from among the plurality of process chambers, as an unusable process chamber, and identifies the unusable process chamber as an available process chamber at a time when the restriction of the unusable process chamber is lifted, and provides the new transporting order by including the available process chamber.

13. The substrate processing apparatus of claim 12, wherein the manufacturing process equipment comprises a single wafer-type processing equipment.

14. The substrate processing apparatus of claim 12, wherein the control server and the manufacturing process equipment transmit or receive the operating information to or from each other in real time.

15. The substrate processing apparatus of claim 12, wherein the semiconductor process comprises forming a material layer on the semiconductor substrate, or
etching a material layer formed on the semiconductor substrate, or
cleaning a material layer formed on the semiconductor substrate.

16. The substrate processing apparatus of claim 9, wherein the control server transmits all operating information of the plurality of process chambers to the manufacturing process equipment at a time when a substrate container containing a plurality of semiconductor substrates is loaded to the load port, and
a number of semiconductor substrates contained in the substrate container is equal to a number of performed process cycles.

* * * * *